United States Patent [19]

Ziger

[11] Patent Number: 5,472,562
[45] Date of Patent: Dec. 5, 1995

[54] METHOD OF ETCHING SILICON NITRIDE

[75] Inventor: David H. Ziger, Altamonte Springs, Fla.

[73] Assignee: AT&T Corp., Murray Hill, N.J.

[21] Appl. No.: 286,606

[22] Filed: Aug. 5, 1994

[51] Int. Cl.⁶ ................................................ H01L 21/00
[52] U.S. Cl. ........................................ 156/657.1; 252/79.3
[58] Field of Search ........................... 156/657.1, 662.1; 252/79.3, 79.1

[56] References Cited

U.S. PATENT DOCUMENTS

| 5,310,457 | 5/1994 | Ziger | 156/662 X |
| 5,348,617 | 9/1994 | Braymen | 156/662 X |

Primary Examiner—Thi Dang
Attorney, Agent, or Firm—Richard D. Laumann

[57] ABSTRACT

Etch baths having phosphoric acid, nitric acid and hydrofluoric acid and used to selectively remove silicon nitride or silicon with respect to silicon oxide have enhanced initial selectivity when silicon is added to the initial bath. The silicon may be added in the form of soluble silicon compounds such a hexafluorosilicic acid or ammonium fluorosilicate.

6 Claims, No Drawings

METHOD OF ETCHING SILICON NITRIDE

TECHNICAL FIELD

This invention relates to a method of integrated circuit manufacture which includes the selective removal of silicon nitride with respect to silicon oxide.

BACKGROUND OF THE INVENTION

Integrated circuit fabrication processes include steps in which materials must be selectively removed with respect to other materials. The removal process may use either wet or dry etching. Regardless of the method selected, are selectivity of the etch between the materials that are removed and those that are not removed should be high. However, selectivity is not the only consideration, the skilled artisan readily appreciates that consistent results over an extended period of time should be achieved.

Dielectric regions, termed field oxides, are formed in integrated circuit fabrication by depositing a dielectric mask layer over silicon (likely having a thin oxide, termed a pad oxide on the surface), pattering the dielectric mask layer to expose the silicon or oxide, and growing a thick oxide in the exposed region. The thick oxide is termed the field oxide. A typical choice of dielectric for the mask layer is silicon nitride. This process is frequently referred to as LOCOS which is a well known acronym for Localized Oxidation of Silicon. In current practice, a polysilicon layer is frequently present underneath the nitride layer. The patterned structure is referred to as a Poly Buffered LOCOS (PBL) stack. Thus, both silicon nitride and polysilicon must be removed without significant attack on the silicon oxide.

Wet etching techniques are commonly used for blanket stripping of nitride and silicon in the presence of oxides. Silicon nitride are etched in boiling phosphoric acid. Minor amounts of nitric acid may be present in the etch bath. These baths are susceptible to aging effect and high particle counts because the silicate concentration in the bath increase with wafer throughput. Other approaches use separate baths for the nitride and polysilicon. This not only increases the number of baths required but may also lead to pitting of the pad oxide.

Of course, etching of these materials in other contexts is also contemplated. See, Solid State Technology, Ernst Gaulhofer, for a description of etching apparatus and etchants. It is reported that nitric, hydrofluoric, and phosphoric acids are used in a 3:1:1 solution to etch silicon. No selectivity is reported nor is there any discussion of rejuvenating the etch solution which is important to minimize chemical usage.

These problems were generally overcome by using a bath that had phosphoric, hydrofluoric, and nitric acids present. See, U.S. Pat. No. 5,310,457 issued on May 10, 1994 to David Ziger which is incorporated herein by reference. The bath life is extended by the addition of hydrofluoric and nitric acids. The bath had a relatively constant etch rate as a function of time. This feature is attributed to a reaction between the hydrofluoric acid and the etch products which leads to reaction products that do not interfere with the rates of the etch chemistry. It is believed that the nitric acid is required to oxidize the silicon.

However, it has been found that the initial etching selectivity of nitride to oxide may be undesirably low, selectivities of 9:1 have been observed, and depends on the relative fluorine concentration in the etch bath. Higher initial etch selectivities are desirable.

SUMMARY OF THE INVENTION

According to this invention, a method of integrated circuit manufacture etches structures having at least one layer of material, which is silicon nitride or silicon, and which is disposed over silicon oxide in a wet etch bath having phosphoric acid, hydrofluoric acid, and nitric acid. Soluble silicon is added to the initial bath to insure high initial selectivity. In a preferred embodiment, soluble silicon compounds are added to the initial etch bath. Examples of such compounds are fluorosilicates including hexafluorosilicic acid and ammonium fluorisilicate.

DETAILED DESCRIPTION

The invention will be described by reference to an exemplary embodiment which etches a silicon nitride/polysilicon stack on an oxide covered silicon surface. Such a stack is used in semiconductor integrated circuit fabrication sequences having poly buffered LOCOS to produce a field oxide. Although the fabrication of such a stack is well known to the skilled artisan, several aspects of the sequence will be briefly summarized. A pad oxide is formed on the surface of the silicon wafer. Polysilicon and silicon nitride layers are now sequentially deposited. Appropriate layer thicknesses and deposition conditions will be readily selected. The polysilicon and silicon nitride layers are now patterned, using well known lithographic processes, to expose selected portions of the oxide covered silicon surface or substrate. The exposed portions are now subjected to further processing which oxidizes the silicon to form the field oxide. Conventional field oxidation processes can be used.

Several comments about terminology are appropriate. Silicon nitride and silicon oxide have compositions which are nominally represented as $Si_3N_4$ and $SiO_2$, respectively. The terms silicon oxide and silicon nitride, as used in this specification, refer to not only the stoichiometric compositions but also oxide and nitride compositions which deviate from the stoichiometric compositions. Polysilicon, as used in this specification, may include regions that may properly be considered amorphous; such regions are typically small.

Before etching silicon nitride or polysilicon with respect to silicon oxide, it has been found desirable to add silicon to the etch bath. The additional silicon enhances the initial etch selectivity. In a preferred embodiment of the invention, a soluble silicon compound is added to the etching bath. Fluorosilicates may be expediently used. Two examples of such compounds are hexafluorosilicic acid and ammonium fluorosilicate. Both of these compounds dissolve readily in phosphoric acid without generating particles. The compounds increase the etch selectivities to 40:1 and 33:1 for silicon nitride and polysilicon, respectively. The additional silicon stabilizes the bath from initial use until use is terminated; the bath is replenished according to the teachings of the previously mentioned patent issued to David Ziger.

Variations in the embodiment described will be thought of by those skilled in the art. For example, the silicon may be added to the bath by etching bare waters or other objects with exposed silicon surfaces. Additionally, a compound that reacts with a bath constituent to form a soluble compound may also be added.

I claim:

1. A method of integrated circuit manufacture comprising the steps of:

forming a silicon oxide surface;

forming structures on said silicon oxide surface, said structures comprising at least one layer, said layer comprising material selected from the group consisting of silicon and silicon nitride;

selectively removing said structures relative to said silicon oxide by etching in an etch bath comprising phosphoric acid, hydrofluoric acid, and nitric acid;

adding soluble silicon to said bath prior to said removing.

2. A method as recited in claim 1 in which said structures comprise at least two layers, one of said layers consisting primarily of silicon, and one of said layers consisting primarily of silicon nitride.

3. A method as recited in claim 2 in which said adding step comprises adding soluble silicon compounds to said bath.

4. A method as recited in claim 3 in which said soluble silicon compound is selected from the group consisting of fluorosilicates.

5. A method as recited in claim 4 in which said fluorosilicate is selected from the group consisting of hexafluorisilicic acid and ammonium fluorisilicate.

6. A method as recited in claim 2 in which said adding step comprises etching an object having an exposed silicon surface in said bath.

* * * * *